United States Statutory Invention Registration [19]

[11] Reg. Number: H580

Vig [43] Published: Feb. 7, 1989

[54] METHOD AND APPARATUS FOR GROWING HIGH PERFECTION QUARTZ

[75] Inventor: John R. Vig, Colts Neck, N.J.

[73] Assignee: The United States of America as represented by the Secretary of the army, Washington, D.C.

[21] Appl. No.: 75,799

[22] Filed: Jul. 16, 1987

[51] Int. Cl.[4] ..... C30B 35/00
[52] U.S. Cl. ..... 422/245; 156/623 Q
[58] Field of Search ..... 422/245, 295, 297; 156/621, 623 Q, DIG. 64; 23/300, 301; 65/DIG. 8

[56] References Cited

U.S. PATENT DOCUMENTS 2,675,303 4/1954 Sobek et al. ..... 156/623 Q
3,394,081 7/1968 Ballman et al. ..... 156/623 Q

FOREIGN PATENT DOCUMENTS 0485531 8/1952 Canada ..... 422/245

OTHER PUBLICATIONS

Gilman, J., "The Art and Science of Growing Crystals", Wiley and Sons Inc., 1963, pp. 231–238.
Brice, J., "The Growth of Crystals from Liquids", North-Holland Pub. Co., 1973, pp. 33, 39–40, 297–300.
Pamplin, B., "Crystal Growth", 2nd Ed., Pergamon Press, 1980, pp. 463–466.
"Woldman's Engineering Alloys," ed. R. C. Gibbons, sixth ed, Amer. Society for Metals, Metals Park, Ohio 44073, 1979, pp. 745–748, 1333–1334, 1439, 1440.

*Primary Examiner*—John F. Terapane
*Attorney, Agent, or Firm*—Sheldon Kanars; Robert A. Maikis

[57] ABSTRACT

A method and apparatus for hydrothermal growing of high perfection quartz by continuously filtering contaminant particles in a separate filter vessel. The filter vessel is attached to the autoclave in which the quartz is grown. Mineralizer is continuously circulated through the filter vessel during the growth process to remove acmite and other contaminants which contribute to etch imperfections and inclusions in the resulting grown quartz.

16 Claims, 1 Drawing Sheet

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

METHOD AND APPARATUS FOR GROWING HIGH PERFECTION QUARTZ

The invention described herein may be manufactured, used, and licensed by or for the Government for governmental purposes without the payment of any royalties thereon or therefor.

TECHNICAL FIELD

This invention relates generally to methods and apparatus for the growth of high perfection quartz.

BACKGROUND OF THE INVENTION

Hydrothermal growth or "culturing" of quartz has been practiced for many years and has presently been refined to a point where virtually all quartz used for frequency control applications today is cultured quartz. In the commonly practiced commercial process for the hydrothermal growth of quartz, a vertical autoclave holds a supply of quartz nutrient in a bottom portion and is filled to some fraction of its free volume with a solution of sodium hydroxide or sodium carbonate. The upper portion of the autoclave includes a plurality of quartz seed crystals supported by a seed rack. After filling, the autoclave is sealed and then heated to increase the temperature and pressure sufficiently to cause the nutrient to dissolve into solution and thereafter be deposited upon the seed crystals. The autoclave is maintained in this condition for a number of days until crystals of a desired size are grown. A perforated metal disc termed a "baffle" is often within the vessel to separate the dissolving and growth zones and to help in localizing a temperature differential between those two zones.

A discussion of the conventional techniques for cultured quartz growth is contained in R. A. Laudise, "Hydrothermal Growth," in *Crystal Growth: An Introduction,* P. Hartman, ed., North Holland Pub. Co., 1973, pp. 162–197. Autoclaves used for the commercial production of quartz are made from steel. Such commercial quartz, after being subsequently cut and etched, customarily exhibits on the order of 50–500 etch channels per $cm^2$. Discussions of etch channel density in quartz may be found in: J. F. Balascio and N. C. Lias, "Standard Characterization Methods for the Determination of the Quality of Hydrothermally Grown Quartz," Proc. 37 th Annual Frequency Control Symposium, 1983, pp. 157–163, and J. F. Balascio and N. C. Lias, "Factors Affecting the Quality and Perfection of Hydrothermally Grown Quartz," Proc. 34th Annual Frequency Control Symposium, 1980, pp. 65–71. Another problem with cultured quartz is that it contains small particulate inclusions. The particles are typically made of sodium iron silicates.

Those concerned with the growth of high perfection quartz for use in precise frequency control and other application have consistently sought to reduce the etch channel and inclusion densities of their product. Various techniques for growing high perfection quartz in limited quantities have been explored and exhibited limited success. A discussion of these techniques is contained in: R. L. Barns, et al., "Dislocation-free and Low-Dislocation Quartz Prepared by Hydrothermal Crystallization," , Journal of Crystal Growth, 43, 1978, pp. 676–686; D. F. Croxall, et al., "Growth and Characterization of High Purity Quartz," Proc. 36th Annual Frequency Control Symposium, 1982, pp. 62–65; A. F. Armington and J. F. Balascio, "The Growth of High Purity, Low Dislocation Quartz," Proc. 38th Annual Frequency Control Symposium, 1984, pp. 3–7. The Barns et al. publication describes the growth of quartz in noble-metal-lined autoclaves. The publication by D. F. Croxall et al. describes crystal growth in an autoclave whose internal surfaces were coated with gold and which contained baffles and seed supports made from either platinum or gold-plated silver. The publication by Armington et al. discusses the use of autoclaves with inert liners and the effects of the addition of lithium to the mineralizer.

Nevertheless, there remains a continuing need for methods and apparatus suitable for the inexpensive commercial production of high perfection quartz.

SUMMARY OF THE INVENTION

Accordingly, it is an object of the present invention to provide a simple, inexpensive method and apparatus for the mass production of high perfection quartz crystals.

It is another object of the present invention to provide a method and apparatus for the production of quartz crystals which exhibit few etch imperfections.

It is a further object of the present invention to provide a method and apparatus for the production of quartz crystals which exhibit few inclusions.

It is believed that a significant contributing factor to the occurrence of etch channels and other etch imperfections, as well as inclusions in quartz is the presence of acmite and other particles in the mineralizer or growth solution. Acmite is particulate matter shed from the steel walls of the autoclave as it corrodes under chemical attack from the mineralizer liquid. Etch channels tend to begin where acmite and other particles deposit on the growing seeds in the autoclave. These particles are introduced into the autoclave both during the loading of the autoclave and subsequently due to corrosion of the autoclave surfaces by the mineralizer.

Evidence that the particles are a significant contributing factor to etch channel production comes from the observation that when seeds are positioned in an autoclave in a non-vertical position, (e.g., horizontally) the etch channel density on the sides of the crystals facing the top of the autoclave is significantly higher than on the sides of the crystals facing the bottom of the autoclave. The most obvious interpretation of this result is that the particles in the mineralizer solution tend (due to gravity and thermally induced convection) to settle predominantly on the top sides of the seeds. Particles on the bottom sides of the seeds are much fewer because they are transported to the bottom surfaces only by turbulent flow and random diffusion in the autoclave.

The particles are very small (micron and submicron sizes). Consequently, any attempt to place a filter within the autoclave itself would also slow circulation of the mineralizer and stop the growth of the crystals.

The present invention provides a dual autoclave system consisting of a growth vessel and a filter vessel. The two vessels are connected near their tops and bottoms. The filter vessel contains a filter. Mineralizer is circulated from the top of the growth vessel through the filter vessel and thence into the bottom of the growth vessel by means of a small pump in the filter vessel. The filter vessel contains filtering material or structures which are capable of removing the particles from the mineralizer without themselves corroding during the growth process. For example, the filter material may be sintered platinum or silver or a corrosion resistant nickel or cobalt alloy such as those sold under the trademarks "Inconel," "Udimet," or "Stellite." The filter material may also be platinum, silver, "Inconel," "Udimet," or "Stellite" gauze. Alternatively, the filter may consist of a series of platinum, silver, "Inconel," "Udimet," or "Stellite" chevrons or baffles upon which the contaminant particles may settle. The pump may, for example, be a small diaphragm or piston pump that is made from "Inconel" or similar corrosion resistant material.

BRIEF DESCRIPTION OF THE DRAWINGS

Further objects and advantages of the present invention will become apparent to those familiar with the art upon examination of the following detailed description and accompanying drawings in which.

DETAILED DESCRIPTION OF THE PREFERRED EMBODIMENTS

Figure 1:
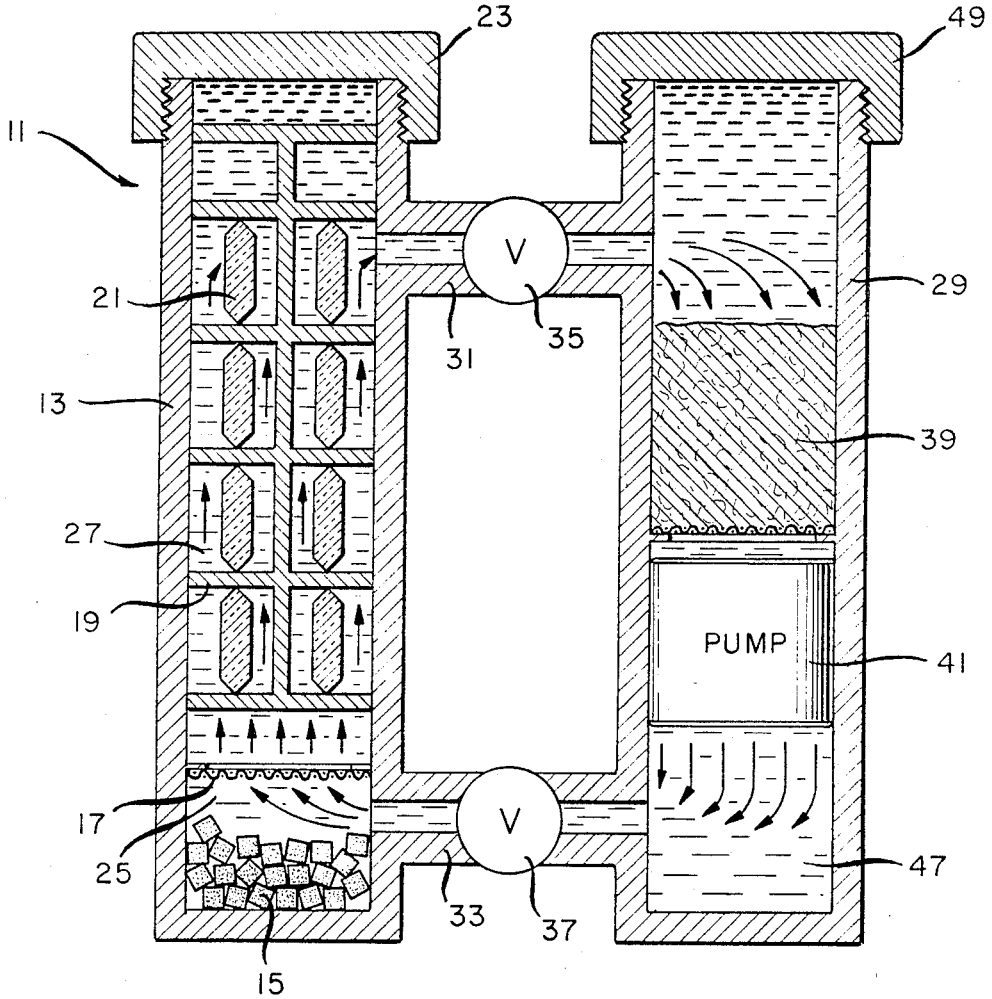
FIG. 1 is a cross sectional and schematic view of a preferred embodiment of the present invention.

Referring to the drawings, wherein like numerals refer to like components throughout, and particularly to FIG. 1, reference numeral 11 designates generally the inventive device. Steel-walled autoclave 13 is cylindrically shaped. Small pieces of quartz, termed "lascas," are deposited within the bottom of autoclave 13. Baffle 17 serves to generally separate the lower region 25 of autoclave 13 from the upper region 27. Rack 19 holds a collection of quartz seed crystals 21. Autoclave 13 is covered with cap 23. In operation, autoclave 13 is partially filled with a mineralizer solution of sodium hydroxide or sodium carbonate. Autoclave 13 is surrounded by heating means capable of heating the lower dissolving section 25 isothermally hotter than the upper growth region 27. The arrangement incorporates appropriate temperature controllers, temperature sensors and suitable shielding against the not inconsiderable explosion hazard. The liquid expands until it fills the autoclave. Baffle 17 helps to localize the temperature differential between the lower region 25 and upper region 27. Those skilled in the art are familiar with standard techniques for insuring the growth of high quality quartz, such as the use of high perfection seeds 21, high purity nutrient 15, and high purity mineralizer. The upper region 27 of autoclave 13 is connected via conduit 31 to filter chamber 29. Filter vessel 29, also surrounded by heating means, is maintained at a temperature that is approximately equal to the temperature of the lower region 25. Conduit 31 may contain a baffle to facilitate the temperature increase between the growth region 27 and the filter chamber 29. Lower region 25 of autoclave 13 is connected via conduit 33 to filter chamber 29. Filter vessel 29 is covered with cap 49.

Alternatively, filter vessel 29 is maintained at a temperature that is approximately equal to the temperature of the growth region 27. A baffle may be placed where conduit 33 is connected to the filter chamber 29. Conduit 33 is heated so that the temperature of the fluid entering autoclave 13 is about the same as the temperature of the lower region 25 of autoclave 13. This arrangement insures that particles remain undissolved in the filter vessel.

A third alternative is to maintain filter vessel 29 at a temperature that is inbetween the temperatures of the growth region 27 and the lower region 25. Baffles then may be placed in both conduits 31 and 33.

Whereas the drawing shows the growth chamber and filter chamber to be approximately equal size, for illustrative purposes, in practice, the filter chamber may have substantially smaller diameter than the growth chamber. The autoclaves used commercially by U.S. growers, typically range in inside diameter from 10 inches (25 centimeters) to 13 inches (33 centimeters). The filter chamber needs to be large enough only to accomodate a small pump and filter; it can, therefore, be as small as one tenth the inside diameter of the growth chamber. It, therefore, need not add significantly to the cost of autoclaves.

In the embodiment of FIG. 1, pump 41 serves to draw mineralizer through conduit 31 through check valve 35, and ultimately through filter 39. Filter 39, in the embodiment of FIG. 1 is either sintered platinum or silver or a sintered corrosion resistant alloy of nickel or cobalt such as those sold under the trademarks "Inconel," "Stellite," or "Udimet." In particular, "Inconel" alloys designated Inconel 601, "Inconel 617," or "Inconel 625" or "Stellite" alloys designated "Stellite 6," "Stellite 7," or "Stellite 8" or a "Udimet" alloy designated "Udimet 625" are suitable materials. The compositions and suppliers of the above alloys are listed on pp. 746, 1333, and 1440 respectively of "Woldman's Engineering Alloys," ed. R. C. Gibbons, sixth ed, Amer. Society for Metals, Metals Park, Ohio 44073, 1979, which is hereby incorporated by reference.

Alternatively, filter 39 may contain gauze or mesh of platinum or silver or any of the above-listed nickel or cobalt corrosion resistant alloys.

Figure 2:
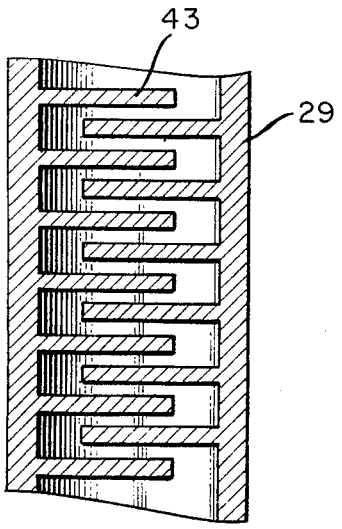
FIG. 2 is a partial cross sectional view of alternative embodiment of the present invention.
Figure 3:
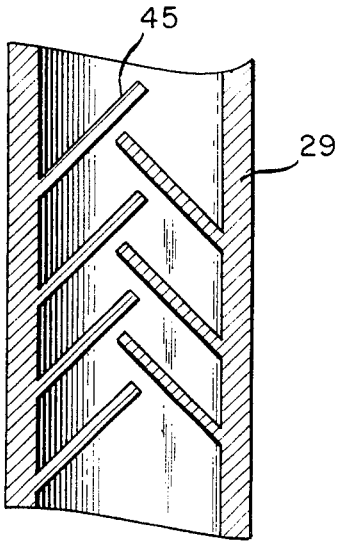
FIG. 3 is a partial cross sectional view of an alternative embodiment of the present invention.

FIGS. 2 and 3 illustrate alternative filtering embodiments. These embodiments provide a large surface areas for the adsorption or particles, with minimal flow impedance. In FIG. 2, a series of baffles 43 made from platinum or silver or any of the above corrosion resistant alloys are horizontally positioned within the walls of filter vessel 29. In FIG. 3 a series of platinum or silver or corrosion-resistant alloy (as listed above) plates 45 oriented upward (so that they resemble chevrons in cross section) may also be employed as a filter. Of course, should it prove desirable, any combination of the above-described filters may be employed in tandem or triplicate.

The pump 41 is designed to provide a highly constant circulation rate. One advantageous method of using the pump is to adjust the pumping rate to provide a mineralizer circulation rate that is equal to the rate that would take place in a conventional, single chamber autoclave due to the temperature gradient across the baffle, and to use a temperature gradient that is somewhat lower than what could be used in the conventional autoclave. Then, one of the main causes of growth irregularity and strains in cultured quartz, i.e. temperatures fluctuations, would be eliminated or minimized because the fluid circulation would be controlled primarily by the pump and not the temperature distribution in the autoclave.

Another advantage is that when the pumping rate governs the mineralizer-circulation-rate, the quartz growth rate can be increased without increasing the temperature and/or temperature gradient and thereby avoid resulting lattice strains and low Q's. In previous attempts at high growth rates the resulting crystals were highly strained due to temperature and concentration gradients at the crystal interfaces.

The device may also be equipped with shut-off valves 35 and 37 located respectively in conduits 31 and 33 so that the filter vessel may be -insolated and cleaned when necessary. Filter vessel 29 also contains a sump 47 at its lower end below the level of conduit 33. Sump 47 may retain additional contaminant particle not trapped by filters 39, 43, or 45.

In addition to reducing the etch channels in grown quartz by eliminating contaminants from the mineralizer, the dual autoclave system herein described may also improve quartz perfection by reducing the amount of turbulence in the growth vessel i.e. autoclave 13. When quartz is grown according to prior art methods, i.e. in a single vessel, the mineralizer must circulate up and down in the same vessel. However, when quartz is grown according to the teachings of the present invention, mineralizer flow is in the upward direction in autoclave 13 and in the downward direction in autoclave 29, thus greatly reducing turbulence during the growth process. Moreover, in the prior art method, it is the temperature gradient that determines the mineralizer circulation rate. Minor temperature fluctuations can upset the circulation and thereby introduce growth irregularities. However, when quartz is grown according to the techniques of the present invention, a constant circulation rate can be maintained by-means of the pump in the flter vessel, independent of any temperature fluctuations. Thus, a more even crystal growth may be expected and contaminant particles in autoclave 13 will exit from the top of vessel 13 rather than being circulated up and down by turbulent flow as in a single autoclave system.

The illustrative embodiments herein are merely a few of those possible variations which will occur to those skilled in the art while using the inventive principles contained herein. Accordingly, numerous variations of invention are possible while staying within the spirit and scope of the invention is defined in the following claims and their legal equivalents.

I claim:

1. An apparatus for the hydrothermal growth of quartz comprising:

first and second autoclaves, said first autoclave containing seed crystals, nutrient and mineralizer;

said second autoclave being connected to said first autoclave and containing means for filtering said mineralizer.

2. The apparatus of claim 1 wherein said filter means includes a sintered material selected from the group consisting of platinum, silver, corrosion resistant nickel alloys and corrosion resistant cobalt alloys.

3. The apparatus of claim 1 wherein said filter means includes a gauze of material selected from the group consisting of platinum, silver, corrosion resistant nickel alloys and corrosion resistant cobalt alloys.

4. The apparatus of claim 1 wherein said filter means includes a plurality of baffles made from a material selected from the group consisting of platinum, silver, corrosion resistant nickel alloys and corrosion resistant cobalt alloys.

5. The apparatus of claim 1 wherein said filter means includes a plurality of upward-tilted baffles made from a material selected from the group consiting of platinum, silver, corrosion resistant nickel alloys and corrosion resistant cobalt alloys.

6. The apparatus of claim 2 wherein said corrosion resistant nickel alloy is selected from the group consisting of "Inconel 601," "Inconel 617," "Inconel 625," and "Udiment 625."

7. The apparatus of claim 2 wherein said corrosion resistant cobalt alloy is selected from the group consisting of "Stellite 6," "Stellite 7," and "Stellite 8."

8. The apparatus of claim 3 wherein said corrosion resistant nickel alloy is selected from the group consisting of "Inconel 601," "Inconel 617," "Inconel 625," and "Udimet 625."

9. The apparatus of claim 3 wherein said corrosion resistant nickel alloy is selected from the group consisting of "Stellite 6," "Stellite 7," and "Stellite 8."

10. The apparatus of claim 4 wherein said corrosion resistant nickel alloy is selected from the group consisting of "Inconel 601," "Inconel 617," "Inconel 625," and "Udimet 625."

11. The apparatus of claim 4 wherein said corrosion resistant nickel alloy is selected from the group consisting of "Stellite 6," "Stellite 7," and "Stellite 8."

12. The apparatus of claim 5 wherein said corrosion resistant nickel alloy is selected from the group consisting of "Inconel 601," "Inconel 617," "Inconel 625," and "Udimet 625."

13. The apparatus of claim 5 wherein said corrosion resistant cobalt alloy is selected from the group consisting of "Stellite 6," "Stellite 7," and "Stellite 8."

14. The apparatus of claim 1 further including first and second conduits both connecting said first and second autoclaves, said first and second conduits each having a respective shut-off valve, and said second autoclave having a pump for circulating said mineralizer.

15. A method for the hydrothermal growth of quartz comprising:

placing seed crystals, nutrient, and mineralizer in an autoclave;

raising the temperature and pressure of said autoclave to promote growth of said seed crystals;

continuously filtering said mineralizer during said growth process.

16. A method for the hypothermal growth of quartz comprising:

placing seed crystals, nutrient, and mineralizer in an autoclave;

raising the temperature and pressure of said autoclave to promote growth of said seed crystals;

pumping said mineralizer from said autoclave, through a filter, and back into said autoclave to control said mineralizer circulation rate.

* * * * *